United States Patent [19]

Marshall et al.

[11] 4,179,792
[45] Dec. 25, 1979

[54] LOW TEMPERATURE CMOS/SOS PROCESS USING DRY PRESSURE OXIDATION

[75] Inventors: Sidney Marshall; Robert J. Zeto, both of Monmouth County, N.J.

[73] Assignee: The United States of America as represented by the Secretary of the Army, Washington, D.C.

[21] Appl. No.: 894,784

[22] Filed: Apr. 10, 1978

[51] Int. Cl.$^2$ ............................................. B01J 17/00
[52] U.S. Cl. .................................... 29/571; 29/576 B; 29/578; 29/590; 148/1.5; 204/192 E
[58] Field of Search ...................... 29/576 B, 578, 590, 29/571; 204/192 E; 148/1.5

[56] References Cited

U.S. PATENT DOCUMENTS

| | | | |
|---|---|---|---|
| 3,590,471 | 7/1971 | Lepselter | 29/576 B |
| 4,117,301 | 9/1978 | Goel | 204/192 E |

OTHER PUBLICATIONS

Electrochem. Soc.: Solid–State Science & Technology, "Dry Pressure Local Oxidation of Silicon for IC Isolation", by Marshall et al., Oct. 1975, pp. 1411 & 1412.
Electrochem. Soc.: Solid–State Science & Technology, "Low Temp. Thermal Oxidation of Silicon by Dry Oxygen Pressure above 1 Atm", by Zeto et al., Oct. 1975, pp. 1409 & 1410.

*Primary Examiner*—W. C. Tupman
*Attorney, Agent, or Firm*—Nathan Edelberg; Sheldon Kanars; Roy E. Gordon

[57] ABSTRACT

An enhancement type, self-aligned silicon gate complementary metal oxide semiconductor (CMOS)/silicon on sapphire (SOS) structure is made by generating all gate oxides and oxide isolated regions with dry oxygen at pressures above 1 atmosphere and at temperatures of 800° C. to 825° C. using ion implantation for all doping operations and plasma definition of all masking dielectrics.

1 Claim, No Drawings

LOW TEMPERATURE CMOS/SOS PROCESS USING DRY PRESSURE OXIDATION

The invention described herein may be manufactured, used, and licensed by or for the Government for governmental purposes without the payment to us of any royalty thereon.

BACKGROUND OF THE INVENTION

This invention relates in general to a method of making silicon integrated circuits and in particular to a method of making an enhancement type, self-aligned silicon gate CMOS/SOS structure.

STATEMENT OF THE PRIOR ART

In the article "Low Temperature Thermal Oxidation of Silicon by Dry Oxygen Pressure Above 1 Atm," by R. J. Zeto, C. G. Thornton, E. Hryckowian, and C. D. Bosco, J. Electrochemical Society 122, 1409 (1975), a method is described of oxidizing silicon using dry oxygen pressures above 1 atmosphere for achieving accelerated oxide growth and for preparing thermal oxides at reduced temperatures. That the dry pressure-oxidation can be applied to integrated circuit structures for gate and isolation oxide growth in bulk silicon and silicon on sapphire was described in the article "Dry Pressure Local Oxidation of Silicon for IC Isolation," by S. Marshall, R. J. Zeto, and C. G. Thornton, J. Electrochemical Society 122, 1411 (1975).

SUMMARY OF THE INVENTION

The general object of this invention is to provide a method of making silicon integrated circuits at temperatures lower than 900° C. A more particular object of the invention is to provide such a method wherein all thermal oxides are grown in a dry oxygen ambient. Another object of the invention is to provide such a method using silicon nitride masking against oxide growth, wherein the consumption of the silicon nitride is negligible. A still further object of the invention is to provide such a method wherein the resulting circuit will be characterized by reduced structural defects and improved reliability. Another object of the invention is to provide such a method wherein the resulting circuit will exhibit improved resistance to the deleterious effects of ionizing radiation. A particular object of the invention is to provide such a method for making enhancement type, self-aligned silicon gate CMOS/SOS structures.

The foregoing objects have been attained by a method generally involving generating all gate oxides and oxide isolated regions with dry oxygen at pressures above 1 atmosphere and at temperatures of 800° C. to 825° C. using ion implantation for all doping operations and plasma definition of all masking dielectrics.

DESCRIPTION OF THE PREFERRED EMBODIMENT

An enhancement type, self-aligned silicon gate, CMOS/SOS structure is made by a method involving the steps of:

(A) cleaning a silicon on sapphire substrate in an acid cleaning solution, (B) oxidizing the silicon layer at 850° C. in dry oxygen at one atmosphere to provide a silicon oxide film of 100 to 300 angstroms in thickness, (C) depositing a silicon nitride film of about 1000 angstroms on the silicon oxide layer at a temperature of 700° C. to 750° C., (D) applying a layer of photoresist to the layer of silicon nitride and defining a pattern in the layer of photoresist, (E) selectively etching the layer of silicon nitride in an RF generated plasma containing a fluorine species, (F) removing the layer of photoresist in an oxygen plasma, (G) oxidizing the silicon layer with dry oxygen under a pressure of about 500 atmospheres and at a temperature of about 825° C. to form islands of silicon isolated from one another by silicon oxide, (H) removing the layer of silicon nitride in an RF generated plasma containing a fluorine species, (I) removing the oxide film formed in (B) with a hydrofluoric acid solution, (J) recleaning the substrate with the acid cleaning solution, (K) applying a layer of photoresist over the substrate and then removing the photoresist from selected islands of silicon, (L) implanting boron into the exposed islands of silicon at 240 kilovolts at a dose rate of about one to $5 \times 10^{11}$ atoms/cm$^2$, (M) removing the photoresist in an oxygen plasma, (N) annealing the substrate in dry oxygen at 900° C. for 60 minutes, (O) cleaning the substrate prior to the growth of a gate oxide, (P) oxidizing exposed silicon islands at 800° C. under a pressure of 150 atmospheres of dry oxygen to obtain a gate oxide film of about 1000 angstroms in thickness, (Q) depositing a layer of polycrystalline silicon about 5000 angstroms in thickness on the substrate by chemical vapor deposition, (R) applying a layer of photoresist over the film of polycrystalline silicon and defining a pattern in the layer of photoresist, (S) removing the polycrystalline silicon by plasma etching from areas not protected by photoresist, (T) removing the remaining photoresist in an oxygen plasma, (U) applying a layer of photoresist over the substrate and then removing the photoresist from selected regions of the substrate, (V) implanting boron at a voltage of 70 kilovolts and at a dose rate of about $1 \times 10^{15}$ atoms/cm$^2$ into the exposed regions of the wafer, (W) removing the photoresist in an oxygen plasma, (X) cleaning the substrate with the acid cleaning solution, (Y) applying a layer of photoresist to the substrate and then removing the photoresist from selected regions of the wafer, (Z) implanting phosphorous into the exposed regions at 200 kilovolts and at a dose rate of about $4 \times 10^{15}$ atoms/cm$^2$, (AA) removing the layer of photoresist in an oxygen plasma, (BB) annealing the substrate in dry nitrogen at a maximum temperature of 900° C. for 60 minutes, (CC) applying a layer of silicon oxide of about 2000 angstroms in thickness over the substrate by chemical vapor deposition, (DD) applying a layer of photoresist over the substrate and defining a pattern in the photoresist, (EE) opening windows in the chemically vapor deposited silicon oxide layer with a hydrofluoric acid etch, (FF) removing the layer of photoresist in an oxygen plasma, (GG) cleaning the substrate, (HH) applying a metallic layer of about 10,000 angstroms in thickness over the substrate, (II) applying a layer of photoresist over the metal layer and defining a pattern in the photoresist, (JJ) etching the metal with an acid solution, (KK) stripping the photoresist in an oxygen plasma, and (LL) heat treating the metal layer at 500° C. for about 10 minutes in a nitrogen atmosphere.

The SOS substrate treated is comprised of an epitaxial layer of silicon grown on a sapphire substrate. It is a commercially available material and its manufacture does not constitute part of this invention. An example of such a material is (100), 1 $\mu$m thick, N-type SOS.

According to this invention, the first step or Step (A) involves cleaning the SOS substrate in a standard acid cleaning solution such as sulfuric and nitric acid.

The next step or Step (B) involves growing an oxide layer on the silicon surface of the SOS material. This can be accomplished using conventional thermal techniques at temperatures not exceeding 900 degrees C. The oxide layer grown is generally between 100 to 300 angstroms in thickness. This thickness range is selected to minimize lateral oxidation during processing, that is, oxidation in a direction transverse to the surface of the substrate, and to inhibit possible strain formation which has been reported to occur at direct silicon nitride-silicon oxide interfaces.

Then, a layer of silicon nitride of about 1000 angstroms in thickness is deposited on the layer of silicon oxide. The silicon nitride layer is deposited at a low temperature of about 700° to 750° C. by the silane-ammonia process using nitrogen as a carrier.

The dry oxygen pressure oxidation carried out in Step (G) achieves the selective dielectric isolation of silicon islands in the SOS layer without prior etching. The silicon surface is not recessed. The lateral oxidation feature of selective oxidation and the specific volume difference between silicon and the growing oxide produces a sloped field transition region which has an advantageous topology for subsequently deposited metal runs. In addition, the transition region shape and the 1 to 2 $\mu$m thickness of the dry oxygen pressure field oxide permit the metal runs across the island edges to be separated further from adjacent oxide-silicon interface regions than is typical of conventional processing. This reduces the effect of parasitic edge devices. Following oxide isolation p-regions are formed by implanting boron in selected islands using thick photoresist masking. A 60-minute anneal at 900° C. is used to establish the desired p-island surface concentration of boron. Then a dry oxygen pressure gate oxide is grown. C-V data on MOS capacitors with dry oxygen pressure gate oxides indicate fixed and mobile charge densities in the low $10^{10}$cm$^{-2}$ range. Breakdown measurements on actual device structures show a gate oxide dielectric breakdown strength of 7 to 8 MV/cm.

The method described herein demonstrates the feasibility of using dry oxygen pressure oxidation to achieve low temperature dry processing in a complete device fabrication sequence. The method applies equally well with only minor modification to bulk silicon integrated circuits requiring oxide isolation. Several points related to the dry oxygen pressure oxidation are worth noting. First, dry oxygen pressure oxidation allows a very wide range of thermal oxide thicknesses to be grown in a dry environment, at low temperatures. Examples with [100] silicon include MOS gate oxides grown at 800° C., 150 atm in 2 hours, and complete oxidation of a 0.75 $\mu$m [SOS] layer to 1.7 $\mu$m of $S_iO_2$ in 15 hours at 850° C., 500 atm. With [111] silicon, 1 $\mu$m of oxide can be grown in about 4 hours at 850° C., 500 atm while 2 $\mu$m of silicon can be completely oxidized in 17 hours at 900° C., 500 atm. Second, the dry oxygen pressure oxidation method is compatible with silicon nitride masked selective oxidation. That is, one can observe less than 100 angstroms conversion loss of nitride to oxide even after 44 hours of dry oxygen pressure oxidation at 825° C. and 500 atm. Moreover, the improved reliability that can be obtained by low temperature processing, the excellent MOS properties of dry oxygen pressure gate oxides, and the thick oxide capability of the dry oxygen pressure oxidation method combine to offer numerous possibilities for innovative device design.

We wish it to be understood that we do not desire to be limited to the exact details of construction shown and described, for obvious modifications will occur to a person skilled in the art.

What is claimed is:

1. Method of making enhancement type, self-aligned silicon gate complementary metal oxide semiconductor/silicon on sapphire structures, said method consisting of:

(A) cleaning a silicon on sapphire substrate in an acid cleaning solution, (B) oxidizing the silicon layer at 850° C. in dry oxygen at a pressure of one atmosphere to provide a silicon oxide film of 100 to 300 angstroms in thickness, (C) depositing a silicon nitride film of about 1000 angstroms on the silicon oxide layer at a temperature of 700° C. to 750° C., (D) applying a layer of photoresist to the layer of silicon nitride and defining a pattern in the layer of photoresist, (E) selectively etching the layer of silicon nitride in an RF generated plasma containing a fluorine species, (F) removing the layer of photoresist in an oxygen plasma, (G) oxidizing the silicon layer with dry oxygen under a pressure of about 500 atmospheres and at a temperature of about 825° C. to form islands of silicon isolated from one another by silicon oxide, (H) removing the layer of silicon nitride in an RF generated plasma containing a fluorine species, (I) removing the oxide film formed in (B) with hydrofluoric acid solution, (J) recleaning the substrate with an acid cleaning solution, (K) applying a layer of photoresist over the substrate and then removing the photoresist from selected islands of silicon, (L) implanting boron into the exposed islands of silicon at 240 kilovolts at a dose rate of about one to $5 \times 10^{11}$ atoms/cm$^2$, (M) removing the photoresist in an oxygen plasma, (N) annealing the substrate in dry oxygen at 900° C. for 60 minutes, (O) cleaning the substrate with a gate oxide cleaning solution, (P) oxidizing exposed silicon islands at 800° C. under a pressure of 150 atmospheres of dry oxygen to obtain a silicon oxide film of about 1000 angstroms in thickness, (Q) depositing a layer of polycrystalline silicon of about 5000 angstroms in thickness on the substrate by chemical vapor deposition, (R) applying a layer of photoresist over the film of polycrystalline silicon and defining a pattern in the layer of photoresist, (S) removing the polycrystalline silicon by plasma etching from areas not protected by photoresist, (T) removing the remaining photoresist in an oxygen plasma, (U) applying a layer of photoresist over the substrate and then removing the photoresist from selected regions of the substrate, (V) implanting boron into the exposed regions of the substrate at a voltage of 70 kilovolts and at a dose rate of about $1 \times 10^{15}$ atoms/cm$^2$ into the exposed regions of the wafer, (W) removing the photoresist in an oxygen plasma, (X) cleaning the substrate with the acid cleaning solution, (Y) applying a layer of photoresist to the substrate and then removing the photoresist from selected regions of the wafer, (Z) implanting phosphorous into the exposed regions at 200 kilovolts and at a dose rate of about $4 \times 10^{15}$ atoms/cm$^2$, (AA) removing the layer of photoresist in an oxygen plasma, (BB) annealing the substrate in dry nitrogen for about 60 minutes at a temperature no greater than 900° C., (CC) applying a layer of silicon oxide of about 2000 angstroms in thickness over the substrate by chemical vapor desposition, (DD) applying a layer of photoresist over the substrate and defining a pattern in the photoresist, (EE) opening windows in the chemically vapor deposited silicon oxide layer with a hydrofluoric acid etch, (FF) removing the layer of photoresist in an oxygen plasma, (GG) cleaning the substrate, (HH) applying a metallic layer of about 10,000 angstroms in thickness over the substrate, (II) applying a layer of photoresist over the metal layer and defining a pattern in the photoresist, (JJ) etching the metal with an acid solution, (KK) stripping the photoresist in an oxygen plasma, and (LL) heat treating the metal layer at 500° C. for about 10 minutes in an atmosphere of nitrogen.

* * * * *